(12) United States Patent
Mandelman et al.

(10) Patent No.: US 6,541,815 B1
(45) Date of Patent: Apr. 1, 2003

(54) HIGH-DENSITY DUAL-CELL FLASH MEMORY STRUCTURE

(75) Inventors: Jack A. Mandelman, Stormville, NY (US); Louis L. Hsu, Fishkill, NY (US); Chung H. Lam, Williston, VT (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/974,968

(22) Filed: Oct. 11, 2001

(51) Int. Cl.⁷ .................. H01L 29/788; H01L 29/76; H01L 29/94; H01L 31/062; H01L 31/119
(52) U.S. Cl. ........................ 257/315; 257/330
(58) Field of Search ................. 257/315, 330

(56) References Cited

U.S. PATENT DOCUMENTS

| | | | |
|---|---|---|---|
| 5,459,091 A | * 10/1995 | Hwang | 257/316 |
| 5,683,941 A | * 11/1997 | Kao et al. | 438/233 |
| 5,998,261 A | * 12/1999 | Hofmann et al. | 438/257 |
| 6,118,159 A | * 9/2000 | Willer et al. | 257/314 |

FOREIGN PATENT DOCUMENTS

JP 03-280580 A * 12/1991 ................. 257/321

OTHER PUBLICATIONS

Guillaumot, B. et al., "FLASH EEPROM Cells using Shallow Trench Isolation", 1996, IEEE, Int'l NonVolatile Memory Conf., pp. 74–75.*

* cited by examiner

*Primary Examiner*—Olik Chaudhuri
*Assistant Examiner*—Howard Weiss
(74) *Attorney, Agent, or Firm*—Joseph P. Abate; Scully, Scott, Murphy & Presser

(57) ABSTRACT

A $2F^2$ flash memory cell structure and a method of fabricating the same are provided. The $2F^2$ flash memory cell structure includes a Si-containing substrate having a plurality of trenches formed therein. Each trench has sidewalls that extend to a bottom wall, a length and individual segments that include two memory cell elements per segment. Each memory cell element comprises (i) a floating gate region having L-shaped gates formed on a portion of each trench sidewall; (ii) a program line overlapping one side of the L-shaped gates present at the bottom wall of each trench and extending along the entire length of the plurality of trenches; and (iii) a control gate region overlying the floating gate region. The control gate region includes gates formed on portions of the sidewalls of the trenches that are coupled to the floating gate regions. The memory cell structure further includes bitline diffusion regions formed in the Si-containing semiconductor substrate abutting each trench segment; and wordlines that lay orthogonal to the trenches. The wordlines are in contact with a top surface of each control gate region.

14 Claims, 15 Drawing Sheets

HIGH-DENSITY DUAL-CELL FLASH MEMORY STRUCTURE

FIELD OF THE INVENTION

The present invention relates to a memory cell structure, and more particularly to a flash memory cell structure which has a high-density (on the order of about $2F^2$) associated therewith.

BACKGROUND OF THE INVENTION

From a circuit aspect, there are two major types of flash memory, i.e., NAND and NOR type. From a device structure aspect, there are many different kinds of flash memory, the most popular structures are the stack gate and split gate. The stack gate device has its entire channel region covered by a floating gate overlapped by a control gate. The split gate device, on the other hand, has part of its channel controlled directly by the floating gate which is modulated by the control gate. There are many other kinds of flash memory, such as virtual ground flash array, and other kinds of split gate NVRAM (non-volatile random access memory) having both control and select gates. Each type of flash memory device has its own advantages and disadvantages associated therewith.

A conventional high-density, high-speed NOR type NVRAM in general has a random read access speed of about 30 nanoseconds, program (or write) speed of from about 1 microsecond to about 10 microseconds, write/erase endurance of about 1E6 cycles, as well as data holding time for greater than 10 years and a cell size of about 0.5 $\mu m^2$.

The most common programming mode is channel hot electron (CHE) injection programming. During write, the control gate is biased to a high voltage level (of from about 7 to about 9 V), while the source is maintained at ground, and the drain is biased to about 3 to about 5 V. Hot electrons generated in the channel region will be injected into the floating gate causing the threshold voltage of the device to shift. For an nMOS flash memory device, the gate oxide has a thickness of from about 7 to about 12 nm, and the channel length is about 0.25 to about 0.5 $\mu m$.

Another programming mode is called Fowler Nordhein (FN) tunneling programming. In this case, a relatively high control gate voltage (about 12 to about 20 V) is needed, while both drain and source can be tied to ground. Such a high programming voltage is needed because the electric field, Eox, which allows tunneling, is about 12 MV/cm. Electrons from the inversion layer in the channel area will tunnel into the floating gate. The advantage of this prior art scheme, however, is low programming power. The most common erase operation is to apply a high voltage of about 12 V on the source side to trigger source side erasure. During the erase operation, the substrate is grounded and the drain side is floating. It is also possible to adopt FN tunneling to the erase operation by applying a negative voltage to the gate (e.g., –8 to –9 V) and a positive voltage (e.g., 3 to 5 V) to the drain and let the source float.

In general, the size of flash memory cells can be made smaller than that of a DRAM (dynamic random access memory). A high-density flash memory contains only-one transistor with a floating gate. Normally, a NAND type array has higher density than NOR type array. However, the performance of NAND type flash memory is not as good as the NOR type. This occurs since programming and reading one cell in the wordline sometimes requires rippling through many cells in a row.

In view of the above drawbacks with prior art flash memory cells, there is a need for forming a new flash memory cell structure which achieves an ultra-high packing density.

SUMMARY OF THE INVENTION

One object of the present invention is to provide a NVRAM-flash memory cell structure which achieves an ultra-high packing density that is on the order of about $2F^2$ where F is the minimum feature size.

Another object of the present invention is to provide a NVRAM flash memory cell structure that allows two cells to be formed adjacently inside a trench such that the two cells can be used to store two bits of data, or one bit of data with complementary values.

A further object of the present invention is to provide a NVRAM flash memory cell structure comprising at least an "L-shaped" floating gate wherein only one side of the L-shaped floating gate overlaps a source line.

A still further object of the present invention is to provide a flash memory cell structure wherein the source line (i.e., program line) of the cell can be separately controlled during reading and programming. This object of the present invention is unlike that of conventional flash memory cells wherein a common source terminal is employed. This feature of the inventive flash memory cell structure enables twin-cells as well as two-bit operation.

An even further object of the present invention is to provide a method of forming a high-density and high-performance flash memory cell.

These and other objects and advantages are achieved in the present invention by providing a flash memory cell structure which includes L-shaped floating gates in trenches that are formed in a Si-containing semiconductor substrate, where one side (bottom) of the floating gate overlaps a source/drain diffusion. This allows two pairs of vertically stacked MOSFETs (i.e., floating gate and the control gate) to be formed in each trench enabling source side programming and 2 bits/trenches (each bit occupying $2F^2$ in area). Alternatively, one bit can be stored if greatly increased noise margin, due to differential operation, is required. Another key feature of the inventive flash memory cell structure is a single source line diffusion which is present in the bottom of each trench.

Specifically, the inventive NVRAM flash memory cell structure comprises: a Si-containing substrate having a plurality of trenches formed therein, each trench having sidewalls that extend to a bottom wall, a length and individual segments that include two memory cell elements per segment, each memory cell element comprising (i) a floating gate region having L-shaped gates formed on a portion of each trench sidewall; (ii) a program line overlapping one side of said L-shaped gates present at said bottom wall of each trench and extending along said entire length of said plurality of trenches; and (iii) a control gate region overlying said floating gate region, said control gate region including gates formed on portions of said sidewalls of said trenches:, said gates are coupled to said floating gate regions;

bitline diffusion regions formed in said Si-containing semiconductor substrate abutting each trench segment; and wordlines that lay orthogonal to said trenches, said wordlines being in contact with a top surface of each control gate region.

The present invention also provides a method for forming the above-mentioned flash memory cell structure. Specifically, the inventive method comprises the steps of:

(a) forming a plurality of trench regions in a surface of a Si-containing substrate: each of said trench regions having sidewalls that extend to a bottom wall that are lined with a first gate dielectric, said bottom wall having an extension implant region formed therein;

(b) forming a doped polysilicon layer, and oxide spacers inside each of said trenches on a portion of said first gate dielectric, while leaving a portion of said first gate dielectric formed on said bottom wall exposed;

(c) implanting a program line through said exposed first gate dielectric, said program line overlapping a portion of said extension implant region;

(d) forming a high-density plasma SiN layer on horizontal surfaces including said exposed first gate dielectric and filling each of said trenches with an oxide fill material;

(e) recessing a portion of said oxide fill material, said oxide spacers, said polysilicon layer and said first gate dielectric so as to form a floating gate region in a lower portion of each trench, said floating gate region including at least L-shaped floating gates;

(f) forming a control gate region overlying said floating gate region, said control gate region including at least a control gate polysilicon layer;

(g) forming at least one line-space mask over portions of said control gate polysilicon layer and segmenting trenches that are not protected by said at least one line-space mask; and (h) removing said line-space mask and forming bitline diffusion regions in said substrate about said plurality of trenches and wordlines above said control gate polysilicon layer which were previously protected by said at least one line-space mask.

DETAILED DESCRIPTION OF THE INVENTION

Figure 1:
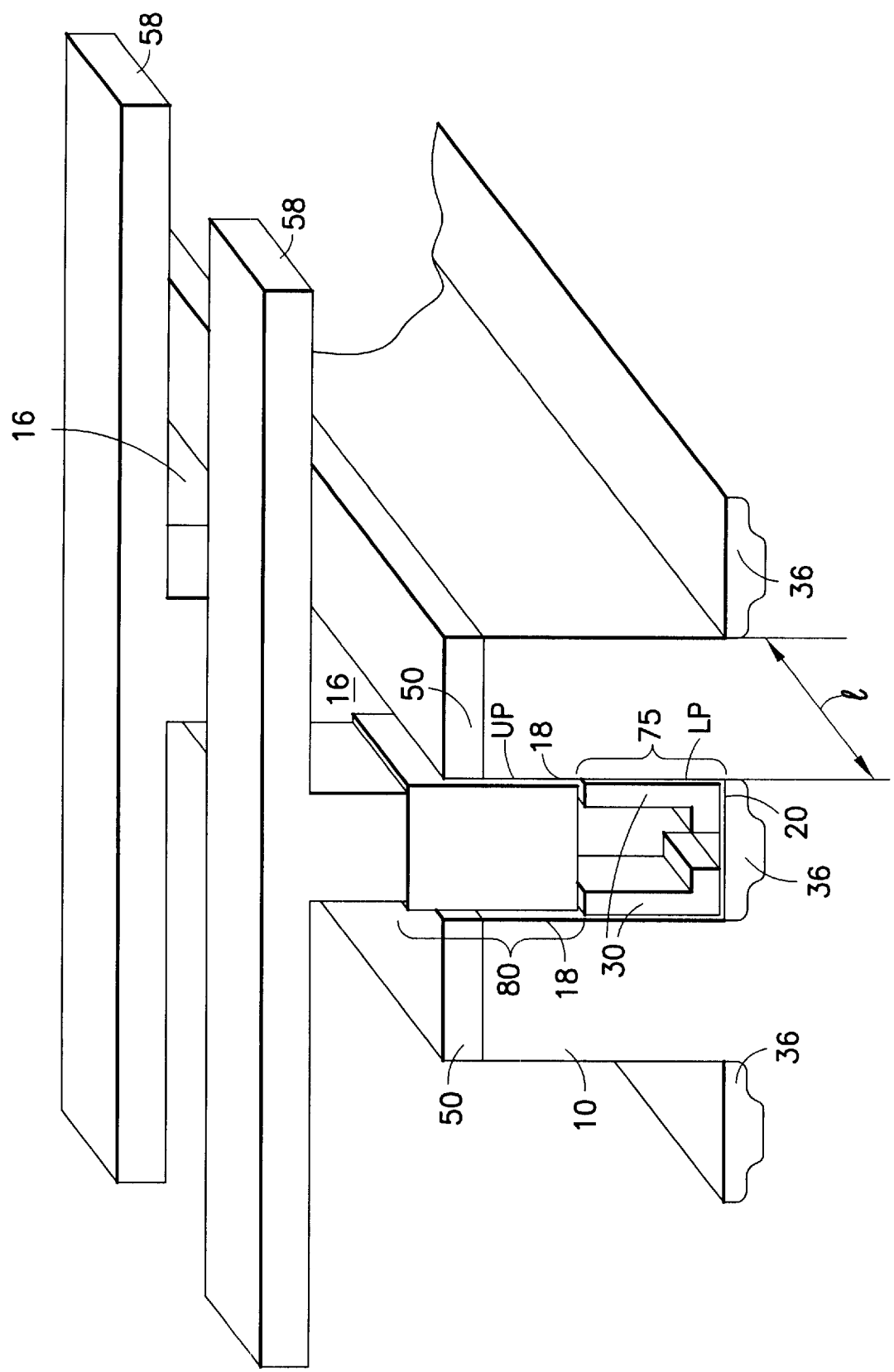
FIG. 1 is a three-dimensional pictorial perspective view of the high-density flash memory cell structure of the present invention.

The present invention, which provides a new and improved high-density and high-performance flash memory cell structure and a method of fabricating the same, will now be described in more detail by referring to the drawings the accompany the present application.

Reference is first made to FIG. 1 which is a three dimensional pictorial representation of the inventive high-density flash memory cell structure of the present invention. Specifically, the inventive flash memory cell structure of the present invention comprises Si-containing substrate 10 having a plurality of trenches 16 formed therein. Each trench has sidewalls 18 that extend to bottom wall 20, a length, l, and individual segments (one of which is depicted in the figure) that include two memory cell elements per segment Each sidewall includes upper portions UP connected to lower portions LP.

Each memory cell element comprises (i) floating gate region 75 having L-shaped gates 30 formed on a lower LP portion of each trench sidewall 18, (ii) program line 36 overlapping one side of L-shaped gates 30 present at bottom wall 20 of each trench and extending along the entire length of the plurality of trenches; and (iii) control gate region 80 overlying floating gate region 75. In accordance with the present invention, control gate region 80 includes gates (not specifically labeled in FIG. 1) formed on upper portions and not on lower portions of each trench sidewall, which are coupled to the floating gate regions.

The structure shown in FIG. 1 also includes bitline diffusion regions 50 (i.e., data lines) formed in Si-containing semiconductor substrate 10 abutting each trench segment; and wordlines 58 that lay orthogonal to the trenches. Wordlines 58 are in contact with a top surface of each control gate region.

Before describing the processing steps employed in fabricating the inventive high-density flash memory cell structure illustrated in FIG. 1, the following detailed description concerning the operational use of the inventive cell will now be provided.

Figure 2A:
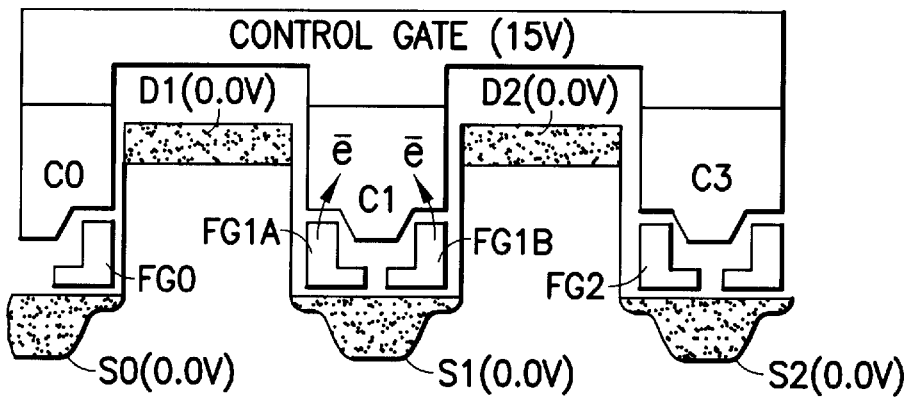
FIGS. 2A–2C are pictorial views (through cross-sections) showing the inventive structure during erase, program and write operations.

(1) Erase: (FIG. 2A)

Before the structure shown in FIG. 1 can be used for programming, the cells must be first erased. Here, a controlled "over-erase" scheme is adopted. In order to perform a blanket erasure, the voltage of the wordlines is raised to about 15 V with all the bitlines and source lines, i.e., program lines, tied to ground. At this moment, the electrons in the floating gate are tunneled into the control gate. Due to the over-erase effect, the floating gate will have a high hole concentration which induces the channel under the floating gate to have a negative threshold voltage ($V_t$ of about −1 V). Therefore, after the erase operation, all the cells are set to a 'high' state. The erase time is in the range of milliseconds. After erase, the structure is ready to program.

Figure 2B:
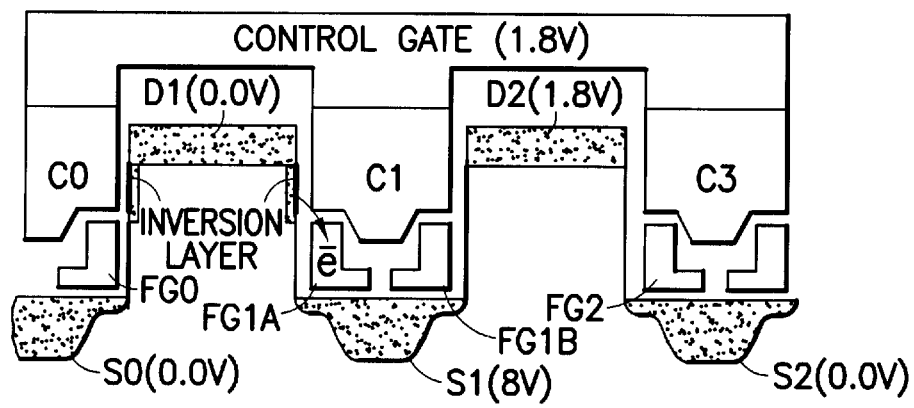

(2) Program: (FIG. 2B)

During programming, one wordline is selected each time to program alternate pairs of cells along that wordline. The wordline voltage is raised to about 1.8 V. If the odd pairs are to be programmed, the source lines of the even pairs are tied to ground while the source lines of the odd pairs are tied to a high-voltage (of about 8 V). The bitlines are also selectively raised to about 1.8 V where cell programming is not desired. The floating gate is coupled by the source line to a predetermined voltage depending on the coupling ratio. Electrons from the bitlines will inject via an inversion layer into the floating gate to combine with the holes and thus increase the device threshold voltage.

After programming, the cells are set to a 'low' state. Note that each pair of cells can be programmed independently. For twin-cell applications, complementary data is always stored in the pair-cells. For example, if a 'high' state is stored, the left cell is not programmed while the right cell is. On the other hand, if a 'low' state is programmed, the right cell is not programmed while the left cell is. The twin-cell trades array density with signal reliability. If two-bit-cell application is chosen, the right cell and left cell can be stored either 'high' or 'low' to achieve high-bit density. At least two-cycle programming, one cycle to program the odd pair, while the other cycle employed to program the even pairs is required to program the whole wordline.

(3) Read: (FIG. 2C)

Also, a two-cycle read is required to read all the data along a wordline. During read of the odd pairs, the control gate is raised to about 1.8 V, all the bitlines are precharged to one volt, the odd source lines are set to ground, and the even source lines are also set to one volt. In this spilt gate flash memory device, a channel is formed by the control gate, the programmed cell will have high $V_t$ and thus the bitline will be maintained at one volt. The unprogrammed cells will have a low $V_t$, the bitline will be discharged and a 'low' state will be sensed by the sense amplifier. The devices of the odd pairs will not conduct, since Vds=0, and therefore have no effect on the even pair cells during read operation. The data from the left cell will be read out-from the left bitline, while the data from the right cell will be read out from the right bitline. In this case, folded bitline architecture can be applied to the twin-cell arrangement, while open-bitline for the two-bit cell arrangement can be used. The former will have a wider signal margin and be less susceptible to coupling noise and thus is believed to more reliable for data sensing.

Figure 2C:
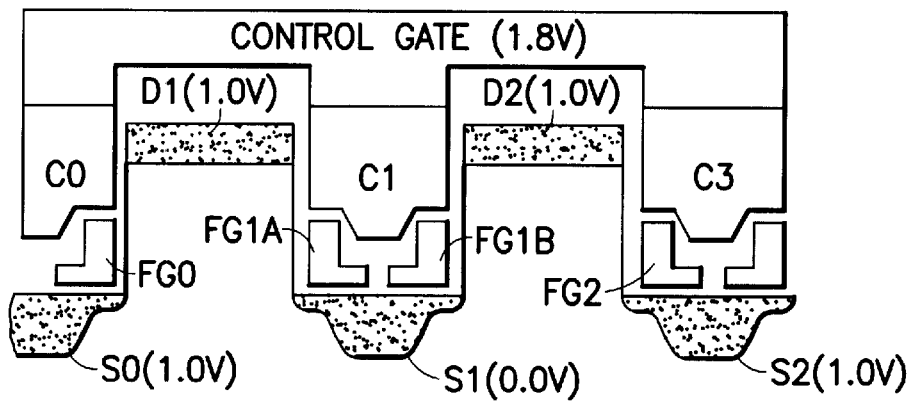

FIGS. 2A–2C shows the inventive flash memory cell during the over erase, program and read operations, respectively. In these figures, FG0, FG1A, FG1B and FG2 denote floating gates, S0, S1, and S2 denote source lines, C0, C1, C2 denote control gates 0, 1, and 2, respectively, and D1, D1 and D2 denote bitlines (or data lines). In FIG. 2B, it is desired to program floating gate FG1A, while not programming FG1B. For the applied voltages shown, an inversion layer is formed on the left hand wall adjacent C1 since $V_{GS}(V_{C1}-V_{D1})>V_T$. An inversion layer is not formed on the right hand wall adjacent C1 since $V_{GS}(V_{C1}-V_{D2})=0$, which is less than $V_T$. Electrons are injected from the edge of the inversion layer on the left hand wall, through the gate dielectric, and into FG1A. This results in FG1A charging with electrons, thus raising its $V_T$. The $V_T$ for FG1B is unchanged since no electron injection has occurred there. Table 1 summarizes the electrical biasing conditions that are employed in each circumstance.

TABLE 1

|  | ERASE | READ | PROGRAM |
|---|---|---|---|
| C0, C1, C2 | 15 V | 1.8 V | 1.8 V |
| D1 | 0 V | 1 V | 1.8 V/0.0 V |
| D2 | 0 V | 1 V | 1.8 V/0.0 V |
| S1 | 0 V | 0 V | 8 V |
| S0, S2 | 0 V | 1 V | 0 V |

Figure 3A:
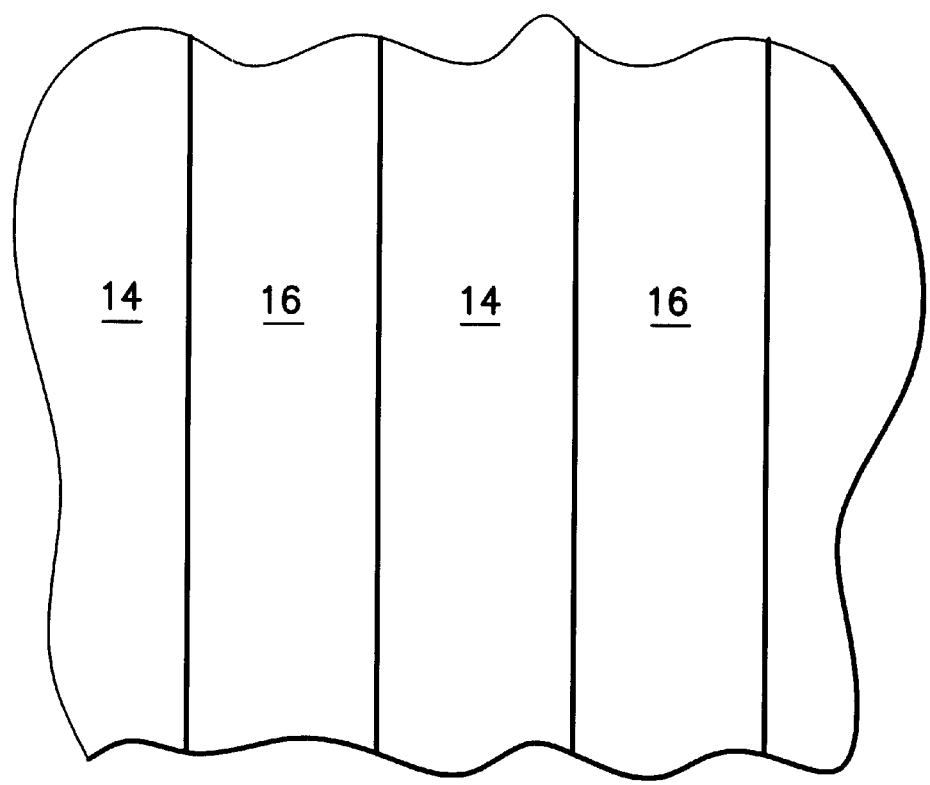
FIGS. 3–17 are pictorial representations showing the inventive flash memory cell structure of FIG. 1 through various processing steps of the present invention. In these figures, Y1—Y1 denotes a cut through trench segments that include a memory cell element, and Y2—Y2 denotes a cut through trench segments that do not include a memory cell element. In some instances, top views are also shown.

The processing steps used in forming the inventive structure shown in FIG. 1 will now be described in greater detail. Reference is first made to FIGS. 3A (top view) and 3B (cross-sectional view through entire trench) which illustrate an initial trench structure that is employed in the present invention. The initial trench structure illustrated,in these figures includes Si-containing substrate 10, patterned pad oxide layer 12 formed; on a portion of Si-containing substrate 10, patterned pad nitride layer 14 formed atop patterned pad oxide layer 12, and trench region 16 formed through both pad layers and a portion of the Si-containing substrate. It is noted that the present invention contemplates the formation of a plurality of trench regions in the substrate. It is also noted that the trenches may be formed into a P-well or N-well region (not specifically shown, but may be included within region 10) that is present in the substrate.

Each trench region includes sidewalls 18 which extend to a common bottom wall 20. The initial structure also includes sacrificial oxide layer 22 which is formed on the sidewalls and bottom wall of each trench.

Figure 3B:
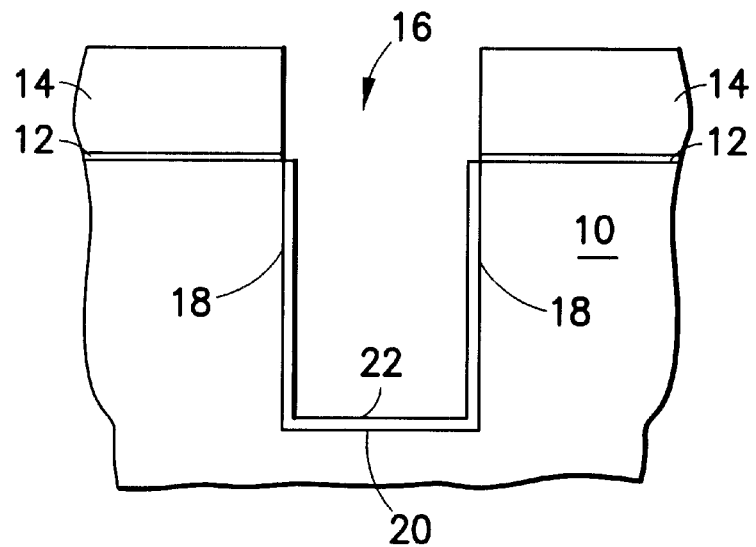

The initial trench structure shown in FIGS. 3A–3B is composed of conventional materials well known in the art and the structure is made using conventional processing techniques that are also well known in the art. For example, the illustrated trench structure of FIGS 3A–3B is prepared by first forming, via a conventional deposition process, such as chemical vapor deposition (CVD), plasma-assisted CVD, and sputtering, or thermal oxidation, a layer of pad oxide 12 on a surface of Si-containing substrate 10. The layer of pad oxide 12 has a thickness of from about 1 to about 15 nm, with a thickness of from about 3 to about 10 nm being more highly preferred. Next, a layer of pad nitride 14 is formed atop the layer of pad oxide using a conventional deposition process such as chemical vapor deposition: (CVD), plasma-assisted CVD, sputtering, chemical solution deposition and other like deposition processes. The layer of pad nitride formed atop the layer of pad oxide has a thickness of from about 50 to about 500 nm, with a thickness of from about 100 to about 300 nm being more highly preferred.

A line-space pattern is then formed in the pad layers and etched into the Si-containing substrate so as to form parallel trenches 16 in the Si-containing substrate. Specifically, the trenches are formed by applying a conventional photoresist (not shown) to the top surface of the layer of pad nitride; exposing the photoresist to a pattern of radiation; developing the pattern into the photoresist; transferring the pattern into the pad layers via a conventional etching process, and thereafter employing a silicon RIE (reactive-ion etching process) to etch the trenches into the substrate. Following the formation of the trenches into the substrate, the photoresist is stripped therefrom and sacrificial oxide layer 22 is formed on the exposed sidewalls and bottom wall of each trench using a conventional deposition process or a thermal oxidation process. The sacrificial oxide layer formed at this point of the inventive process has a thickness of from about 1 to about 15 nm, with a thickness of from about 3 to about 10 nm being more highly preferred.

Figure 4:
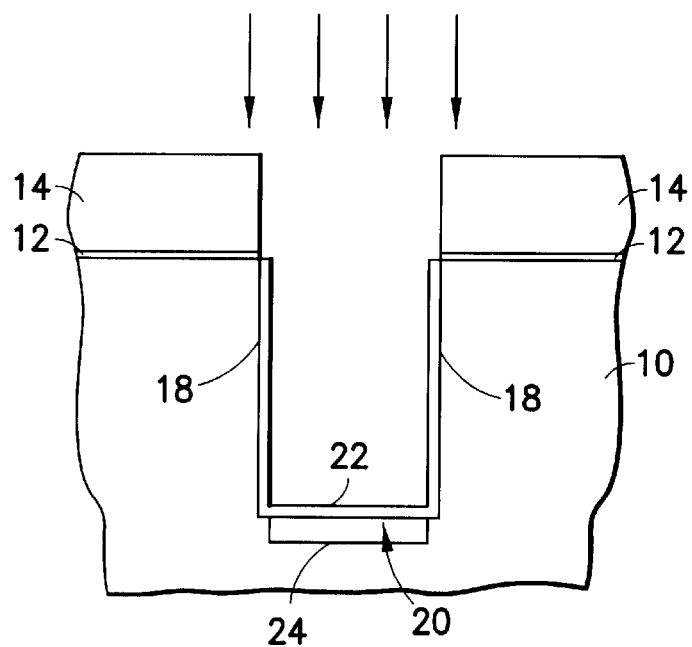

Next, and as shown in FIG. 4, an N or P extension implant region 24 is then formed through the bottom wall of each trench using conventional ion implantation and annealing processes well known to those skilled in the art. When a well region is present in the substrate, the extension implant region has a conductivity that is opposite to the well region. The purpose of this implant is to assure that the lateral edge of the junction of the floating gate region will be coincident with the corner of the trench at the end of the inventive method. This avoids the problem of electron transport over the potential barrier induced by the corner, and also improves the immunity to punchthrough between the diffusions at the bottom of each trench.

Figure 5:
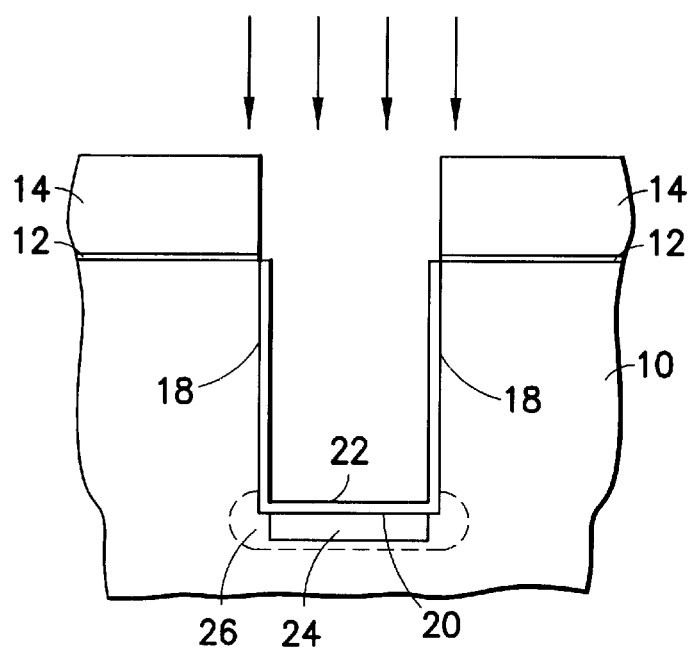

At this point of the present invention, an optional P or N type halo implant may be performed so as to form halo implant region 26 about extension implant region 24. The resultant structure that is formed after this optional implant step is shown, for example, in FIG. 5. In the present invention, the conductivity of the halo implant is opposite that of the extension implant. The optional halo implant is also performed to improve punchthrough immunity of adjacent diffusions at the bottom of each trench. Since the halo implant is optional, the remaining drawings do not show the presence of the halo implant region therein.

Figure 6:
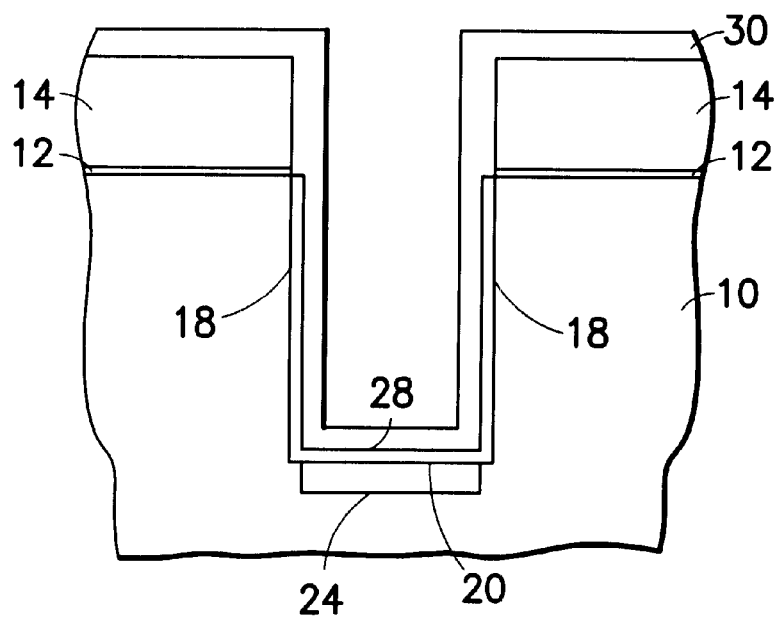

Next, sacrificial oxide layer 22 is stripped from each trench using a conventional etching process which has a high selectivity for removing oxide as compared to Si and nitride. First gate dielectric 28 (See FIG. 6) is then formed on the exposed sidewalls and bottom wall of each trench. The first gate dielectric may be an oxide, oxynitride, or any combinations thereof including multilayers. The first gate dielectric may be formed by a conventional deposition process such as CVD, plasma-assisted CVD, sputtering, and chemical solution deposition, or alternatively the first gate dielectric may be formed by thermal oxidation or oxynitridation. Note that the first gate dielectric will subsequently lie under the L-shaped gates of the floating gate region.

The thickness of the first gate dielectric formed at this point of the present invention may vary depending upon the type of dielectric material employed as well as the process used in forming the same. Typically, however, first gate dielectric 28 has a thickness of from about 7 to about 12 nm, with a thickness of from about 8 to about 15 nm being more highly preferred.

A thin layer of N+ or P+ doped polysilicon (labeled as reference numeral 30 in FIG. 6) is then formed over all exposed horizontal and vertical surfaces of the structure. Doped polysilicon layer 30 is formed using a conventional conformal deposition process well known to those skilled in the art. The thickness of doped polysilicon 30, which will subsequently form an element of the floating gate region of the structure, is from about 4 to about 25 nm, with a thickness of from about 5 to about 20 nm being more highly preferred.

Optionally, the doped polysilicon layer may be etched at this point of the inventive process so as to form polySi spacers within the trench. This optional embodiment is not shown in the drawings of the present invention, but its configuration would look similar to the one depicted in FIG. 6 except that the doped polysilicon layer would be contained entirely on the sidewalls of each trench. The preferred embodiment of the present invention defers this step to a latter point in the inventive process so as to allow the formation of feet on the floating gates for improved coupling to the program line.

Figure 7:
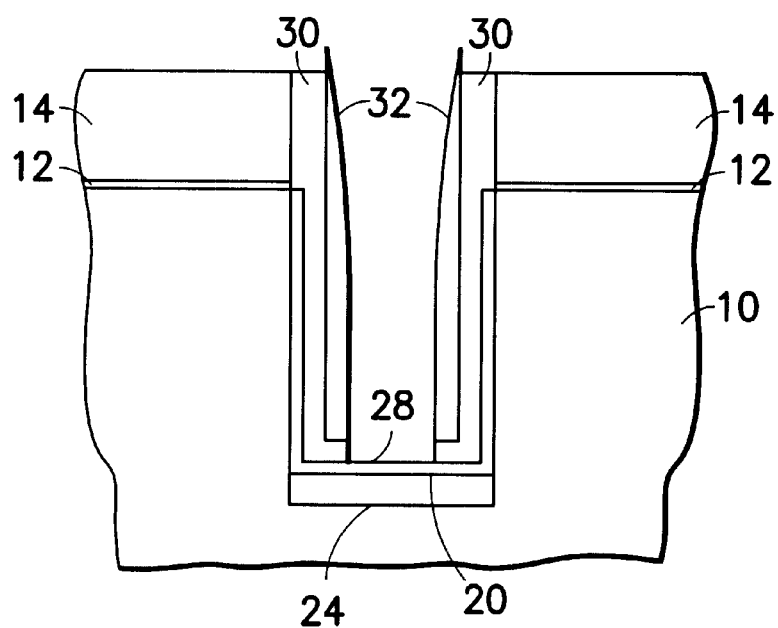

Next, oxide spacers 32 are formed on a portion of doped polysilicon layer 30 using conventional techniques well known to those skilled in the art. Specifically, the oxide spacers are formed using a conventional conformal deposition process followed by a conventional etching process such as RIE. Note that the oxide spacers are formed only on a portion of the doped polysilicon layer that lines the bottom wall of each trench. The exposed portion of the doped polysilicon which is not protected by the oxide spacers is removed at this point of the inventive method using a conventional etching process such as RIE that is highly selective in removing polysilicon as compared with oxide or nitride. The resultant structure that is formed after these steps have been performed is shown in FIG. 7. Note that doped polysilicon layer has feet which extend onto a portion of the bottom wall of each trench and that a portion of first gate dielectric 28 that lays above a portion of the extension implant region is exposed after the etching step.

Figure 8:
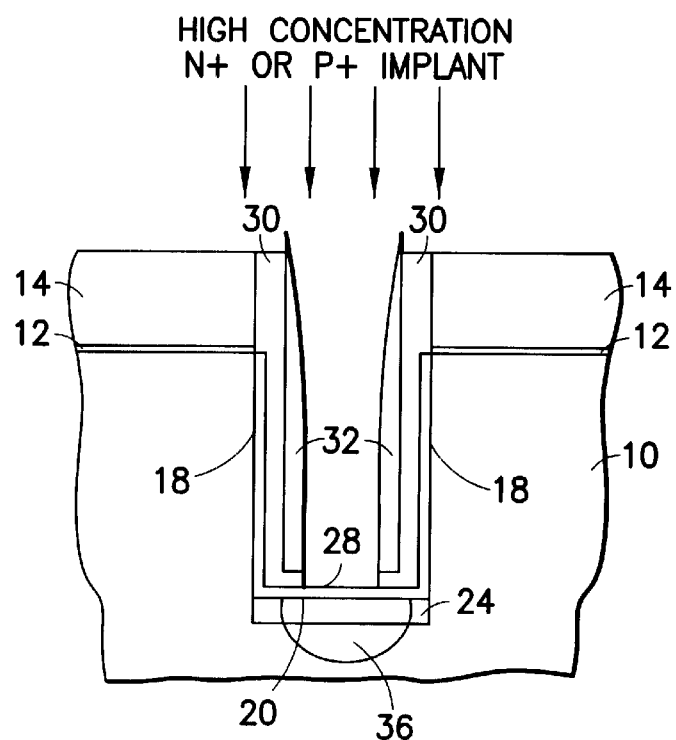

FIG. 8 shows the structure during the formation of high concentration N+ or P+ implant region 36 into the bottom of each trench using the pad nitride and spacers as a mask. Note that this implant region is of the same conductivity type as that of extension implant region 24. This implant step forms program line 36 for the NVRAM cell. The implant is intentionally made into the central portion of each trench to confine the heavily doped region and to enhance punch-through immunity to adjacent programming lines.

Figure 9:
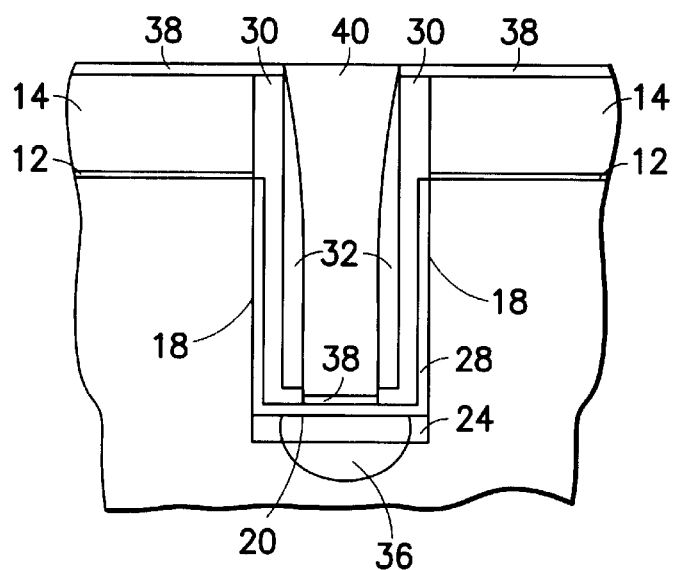

A layer of high-density plasma (HPD) SiN 38 is than deposited on all horizontal surfaces present in the structure. The HPD SiN layer serves to protect the silicon at the bottom of each trench from subsequent etching processes. The trenches are then filled with oxide 40 such as TEOS (tetraethylorthosilicate) or HDP oxide using a conventional deposition process well known to those skilled in the art and thereafter a conventional planarization process such as chemical-mechanical polishing (CMP) or grinding is performed so as to planarize the oxide fill material to the top surface of HPD SiN layer 38. The resultant structure formed after the above steps have been carried out is shown in FIG. 9.

At this point of the inventive method a short nitride RIE is employed to remove the HDP SiN layer from atop the pad nitride layer. The oxide fill and oxide spacers are then recessed selective to the pad nitride layer, preferably by a directional etching process. The exposed portions of doped polysilicon in the upper portion of each trench is then removed with an isotropic silicon etching process. Note that this etching step forms floating gate regions 75 which are comprised of a portion of doped polysilicon layer in the bottom portion of each trench. The exposed first gate dielectric in the upper portion of each trench is also removed at this point of the present invention using an etching process that is highly selective in removing gate dielectric material.

Figure 10:
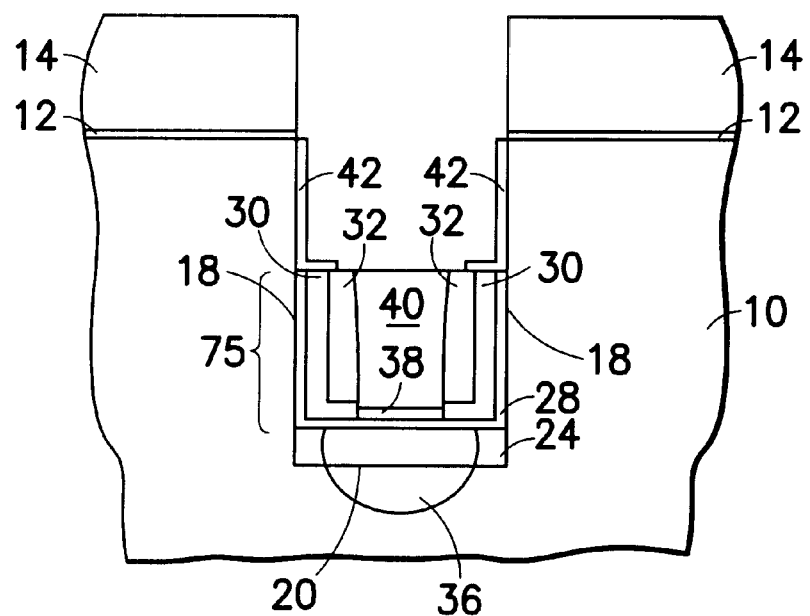

A second gate dielectric (labeled as 42 in FIG. 10) is then formed on the upper exposed sidewalls of each trench. The second gate dielectric forms a portion of the control gate insulator shown in FIG. 1, and also forms the interlayer dielectric between floating gate and control gate. The second gate dielectric may be composed of the same or different dielectric material as the first gate dielectric and any of the above-mentioned processes used in forming the first gate dielectric can be employed in forming the second gate dielectric layer. In a preferred embodiment of the present invention, the second gate dielectric is a regrown gate oxide layer. The second gate dielectric layer may have a thickness on the silicon sidewall that ranges from about 3 to about 25 nm, with a thickness of from about 5 to about 15 nm being more highly preferred. In this step of the present invention, the second gate. dielectric which will be between the control gate and the floating gate is also formed on the top surface of the floating gate. Due to the high doping concentrate of floating gate poly 30 a thermal oxidation process for second gate dielectric grows thicker on the floating gate poly 30 than on the single crystal sidewall. A thickness of second gate dielectric on polysilicon 30 ranges from about 10 to about 35 nm, with from about 15 to about 30 nm more highly preferred.

Figure 11:
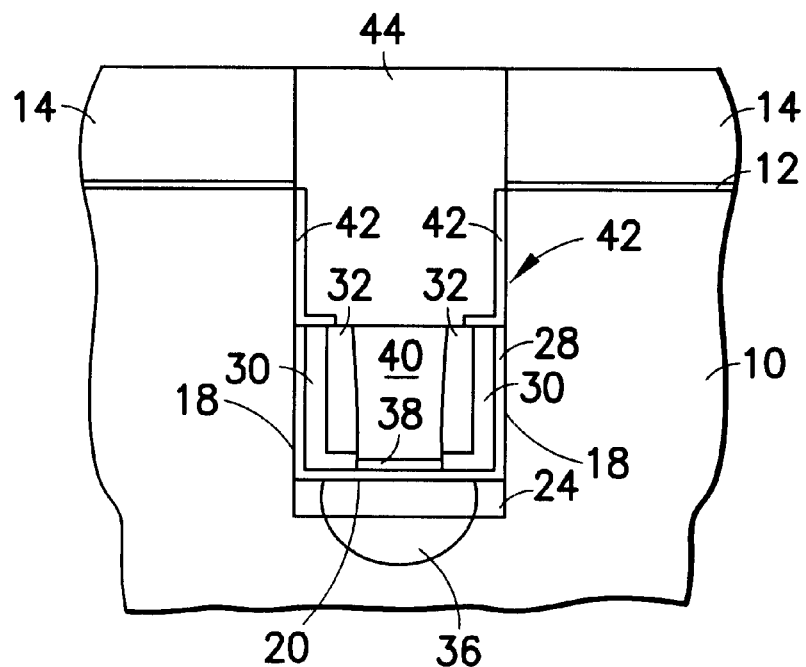

Next, control gate polysilicon 44 is formed in each trench using a conventional deposition process such CVD, plasma-assisted CVD or sputtering, and thereafter the deposited control gate polysilicon is planarized to the top surface of nitride pad layer 14. The resultant structure formed after deposition and planarization is shown in FIG. 11.

Figure 12A:
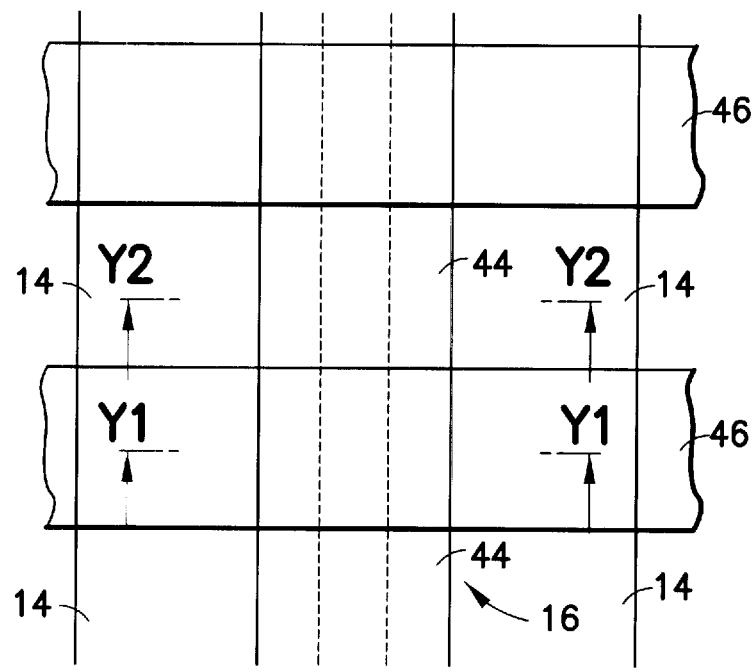
Figure 12B:
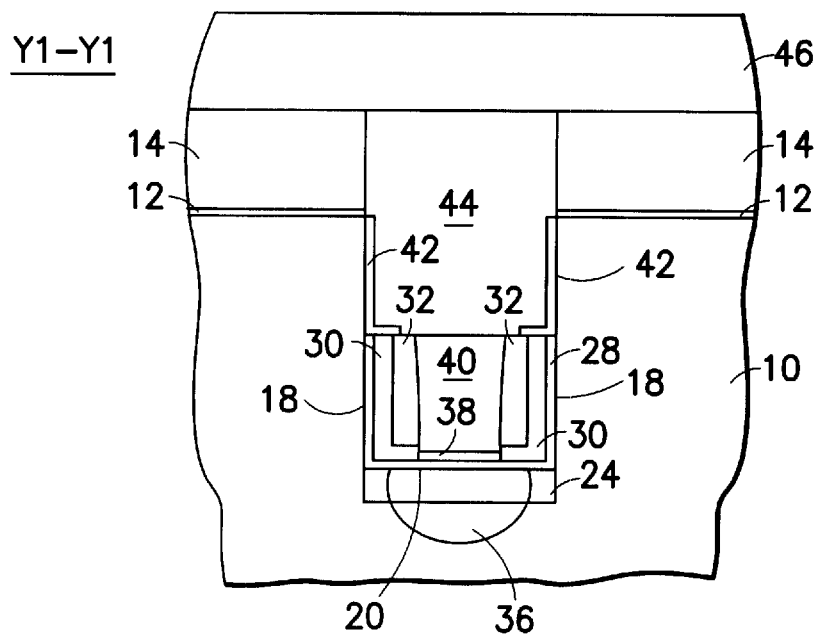
Figure 12C:
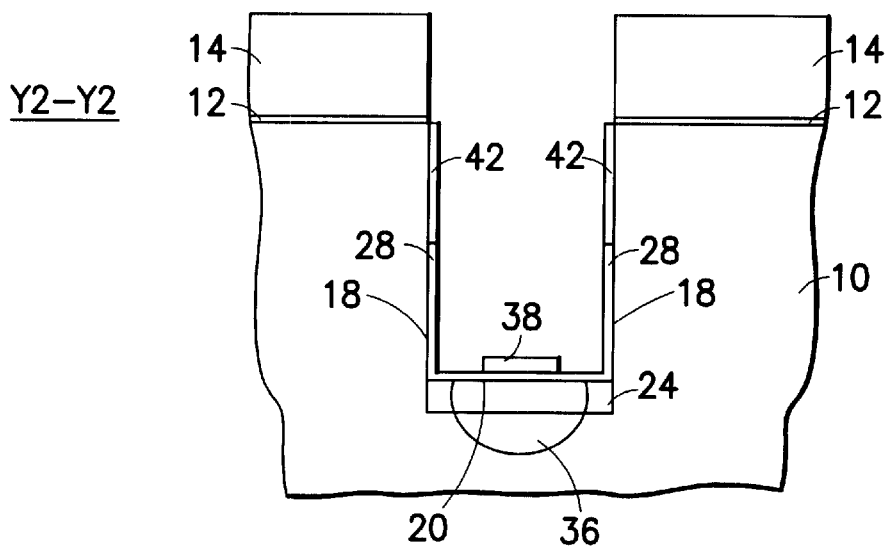

Reference is now made to FIGS. 12A, 12B and 12C which illustrate the structure that is formed after segmenting each trench region. FIG. 12A is a top view, FIG. 12B is a cut through Y1—Y1 and FIG. 12C is a cut through Y2—Y2. In accordance with the present invention, a photoresist mask or hardmask is applied to the structure shown in FIG. 11 and then conventional lithography is employed to pattern the photoresist mask or hardmask into line-space masks 46. The line-space masks protect predetermined portions of each trench (See, FIG. 12B), while leaving other portions exposed for segmentation (See FIG.12C).

The segmentation of the unprotected trenches begins with selectively etching the exposed control gate polysilicon using a RIE process that is selective to nitride. This etching step exposes oxide fill material 40 between the floating gates. The exposed oxide fill material is then etched selective to nitride stopping on HDP SiN layer 38 at the bottom of each trench. This exposes the floating gate polysilicon (i.e., doped polysilicon layer 30) between the patterned line-space masks.

The exposed floating gate polysilicon is then isotropically etched selective to oxide and nitride segmenting the floating gate poly lines, See FIG. 12C. Since the floating gate layer is very thin, minimal undercutting into the adjacent cell region occurs.

Figure 13:
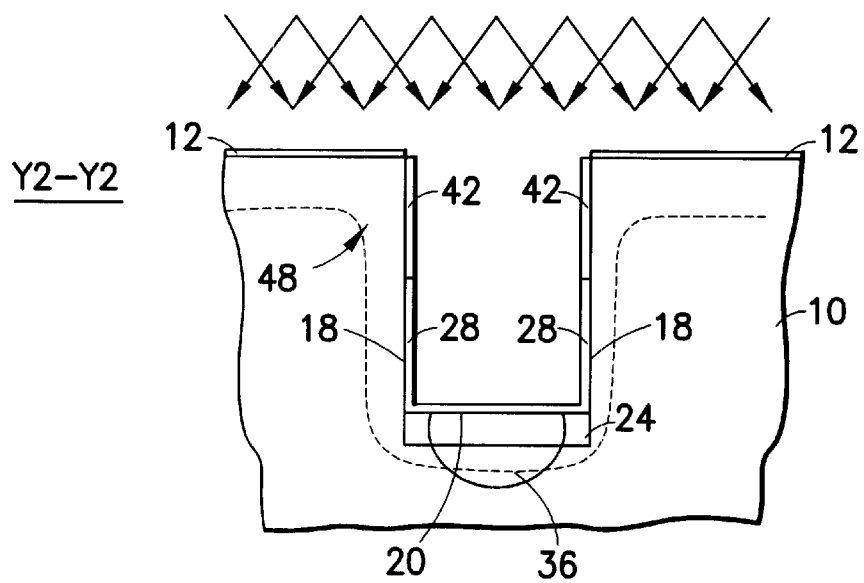

With the line-space mask still protecting portions of the trench, the exposed pad nitride in the segmented regions are etched selective to silicon, oxide and the line-space mask material. This SiN etch also removes the HDP SiN at the bottom of the trench. Next, and as shown in FIG. 13 (cut through Y2—Y2), a P-isolation angled implant is then carried out in the segmented trench regions masked by the line-space mask and the nitride pad in the cell areas that are protecting the trench segments that include the cells so as to form P-isolation region 48 in substrate 10.

Figure 14A:
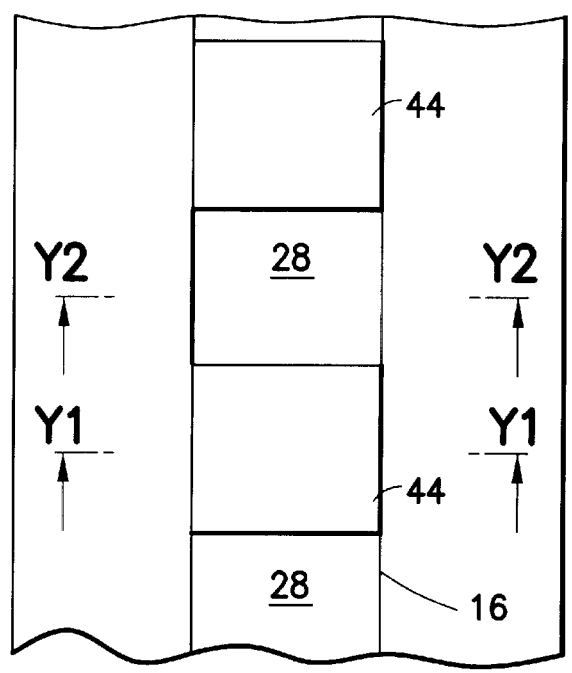
Figure 14B:
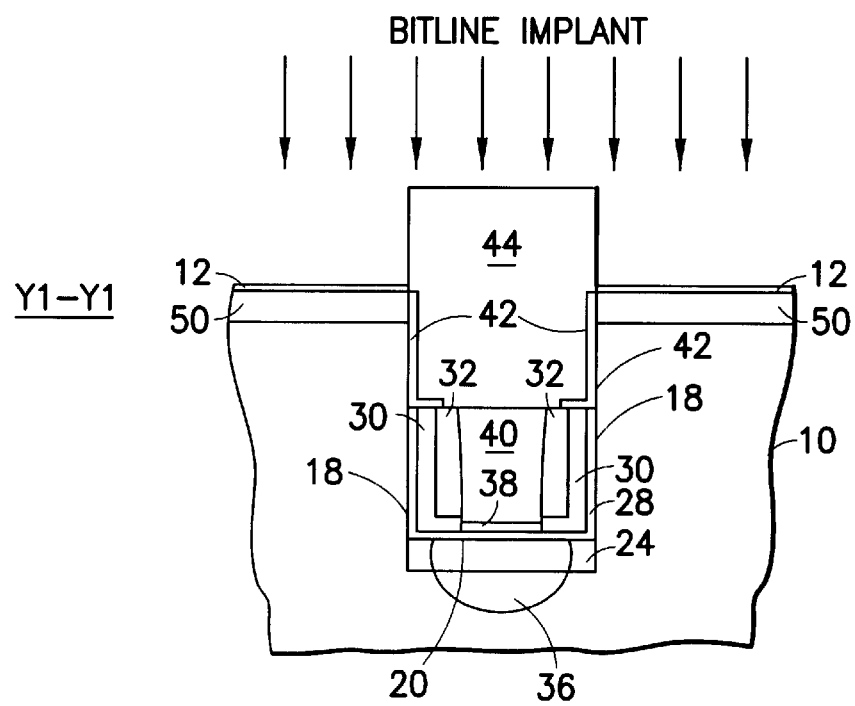
Figure 14C:
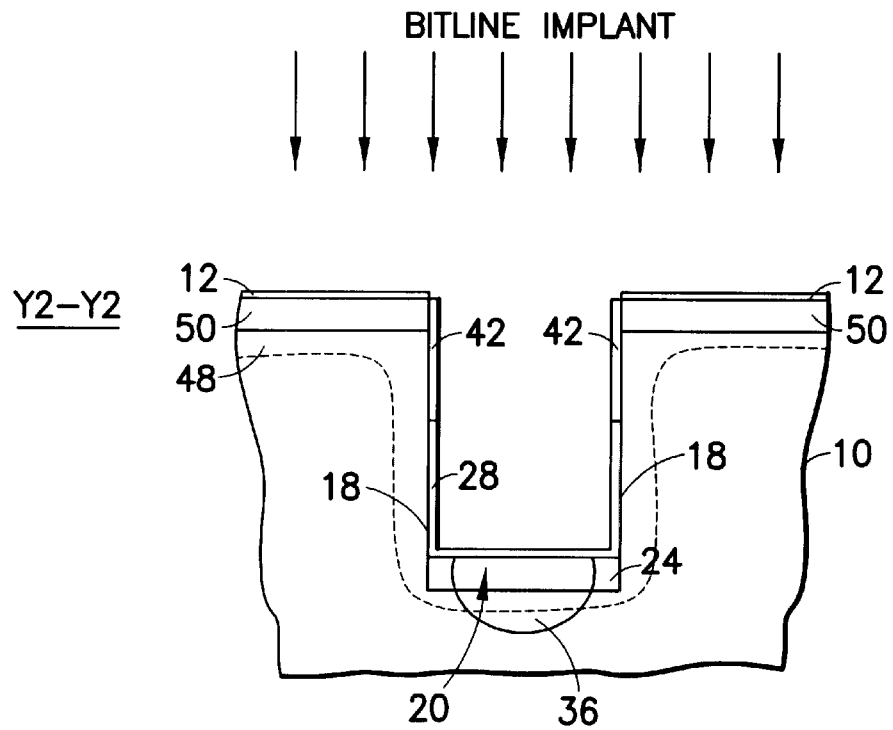

Line-space masks 46 are then removed using a conventional stripping process and the pad nitride layer is stripped to expose the thin pad oxide in the device region (Y1—Y1). Bitline diffusion implants are then performed on the entire structure so as to form bitline diffusion regions (data lines) 50 in exposed portions of the Si-containing substrate. These steps of the present invention are shown in FIGS. 14A (top view), 14B (cut through Y1—Y1) and 14C (cut through Y2—Y2). Note that bitline diffusion regions 50 are present about portions of the segmented trenches that do not contain the memory cells as well as the portion of the trenches that contain the memory cells.

Figure 15A:
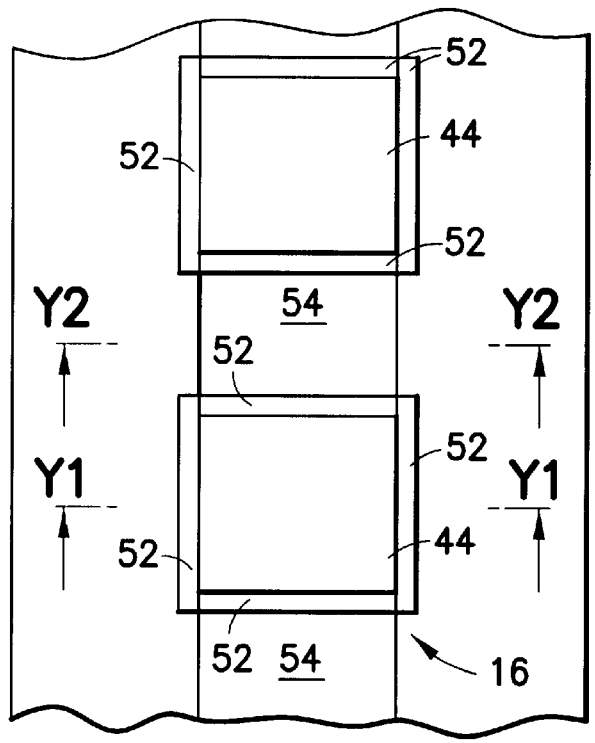
Figure 15B:
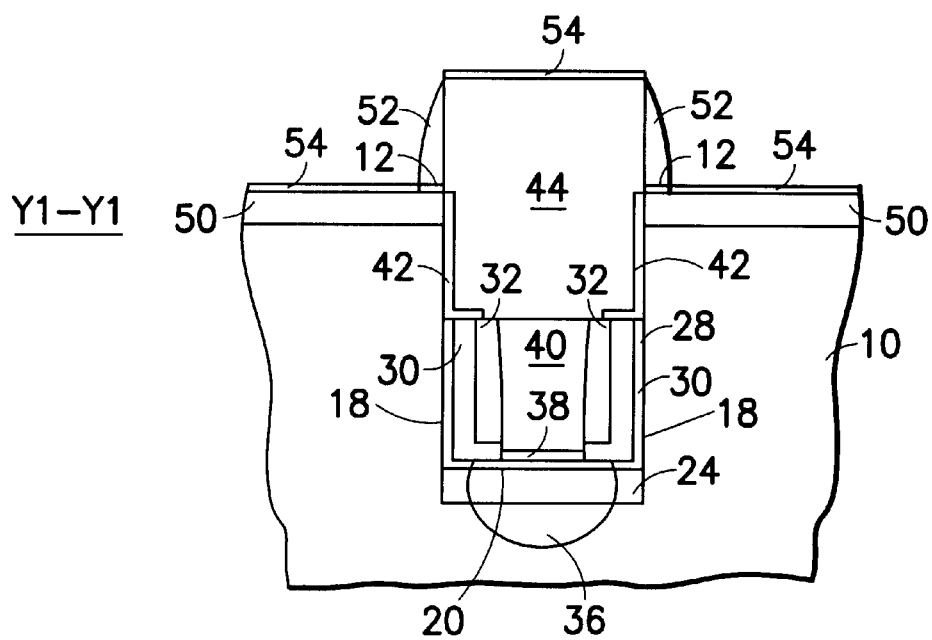
Figure 15C:
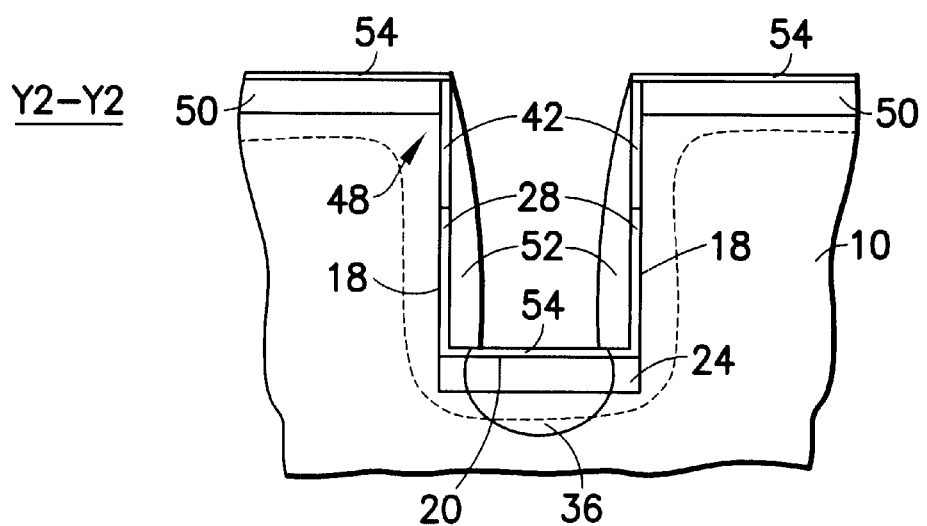

Next, insulating spacers 52, preferably composed of SiN, are formed using conventional techniques, e.g., deposition and etching. The insulating spacers are formed about the exposed control gate polysilicon in the device region as well as within the trenches that have been segmented. The pad oxide in both regions is then removed using a conventional etching process that is highly selective in removing oxide and the exposed surface of Si and control gate polysilicon may be optionally salicided using a conventional salicidation process well known to those skilled in the art. The resultant structure formed after these steps is shown in FIG. 15A (top view), FIG. 15B (cut through Y1—Y1) and FIG. 15C (cut through Y2—Y2). Note that in each of FIGS. 15B and 15C insulating spacers 52 are present as well as optional salicide regions 54.

Figure 16A:
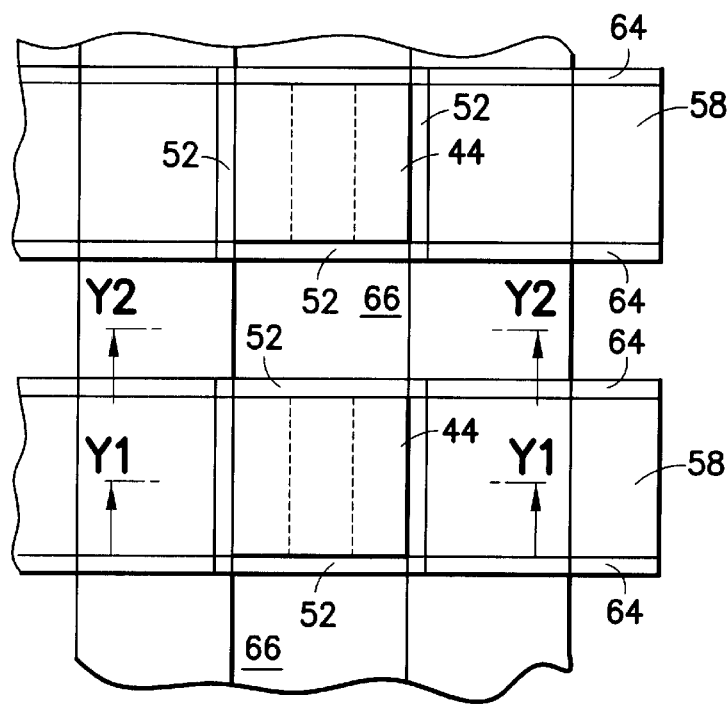
Figure 16B:
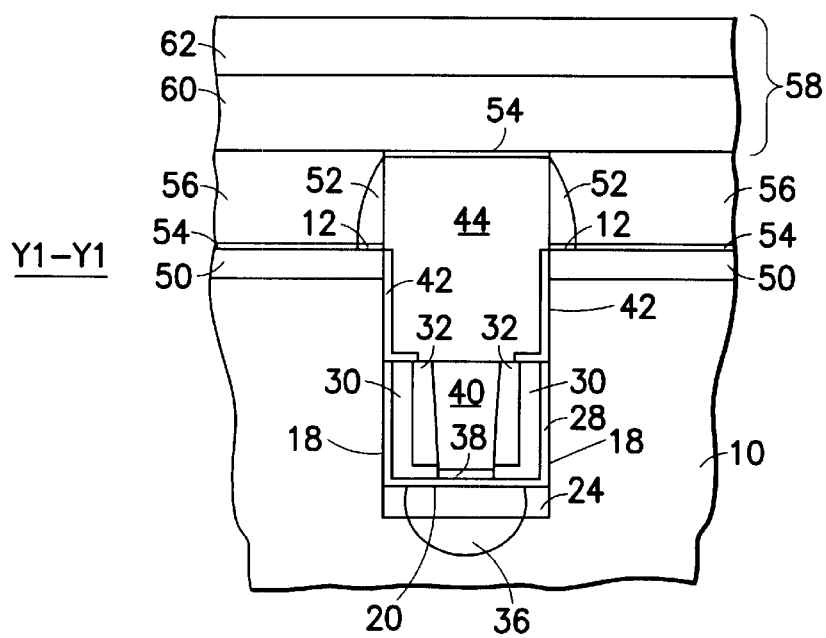
Figure 16C:
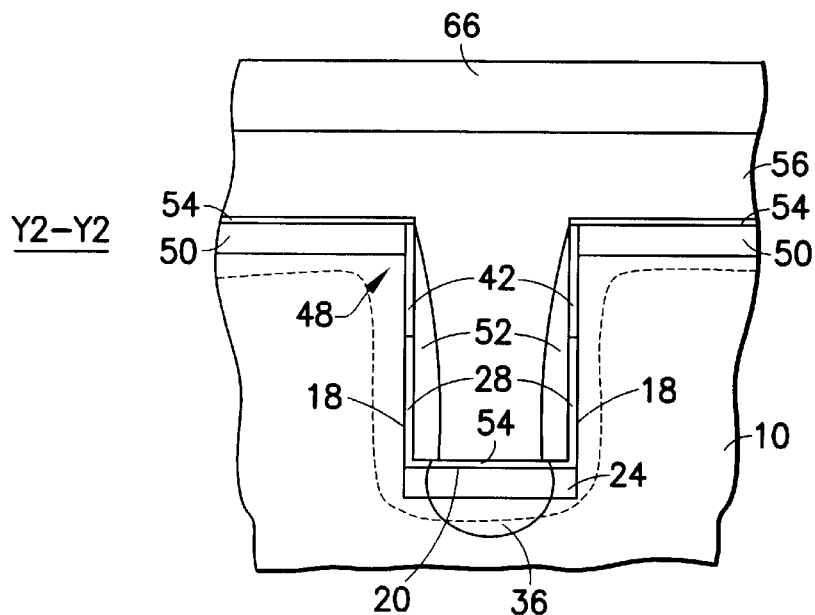

Reference is now made to the structure shown in FIGS. 16A (top view), 16B (cut through Y1—Y1) and 16C (cut though Y2—Y2) which show the structure after the wordlines have been formed orthogonal to the trenches. Specifically, the structure shown in these figures is formed by as follows: A layer of soft insulating material 56 such as TEOS or boron doped phosphorus silicate glass (BPSG) is deposited and planarized to the top surface of the control gate polysilicon. Note that some of the salicide over the control gate may be removed by this operation. Planarization of oxide using a poly stop is a well known technique that is used in vertical DRAM technology to polish bitline contact studs to a top surface oxide layer, therefore no further elaboration of this planarization process is needed herein. The wordline gate stack 58 is deposited using conventional deposition processes well known in the art. The wordline gate stack comprises at least conductive material layer 60 and nitride capping layer 62 formed atop the conductive material layer. The conductive material layer may be composed of any conductive material such as tungsten, tungsten silicide or any other metal or metal silicide. The wordline stack is then patterned and etched, stopping on the soft insulating layer formed above. Standard wordline sidewall-nitride spacers 64 are formed to facilitate subsequent formation of borderless contacts to the bitline diffusions. A second oxide layer 66 is then deposited and planarized to the top surface of the wordline nitride-capping layer.

Figure 17A:
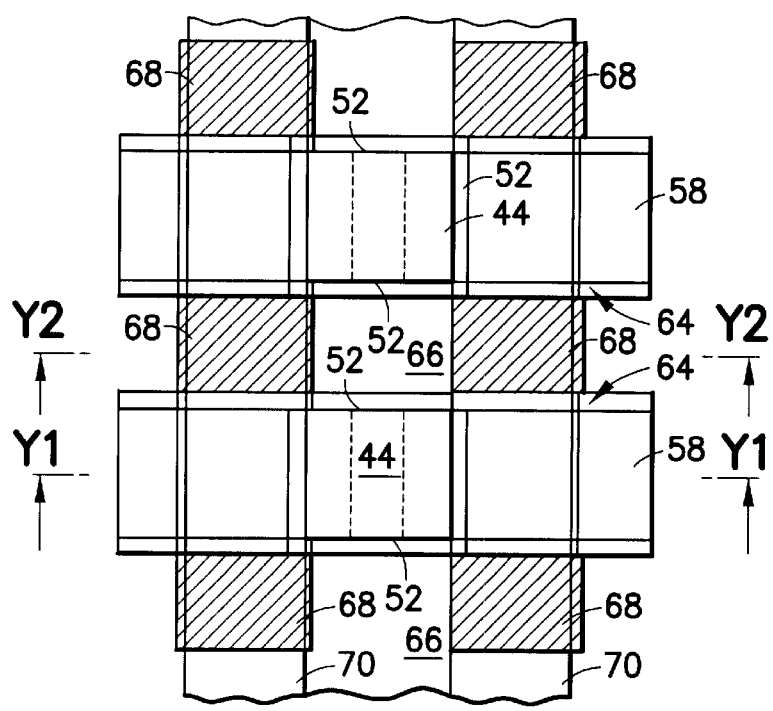
Figure 17B:
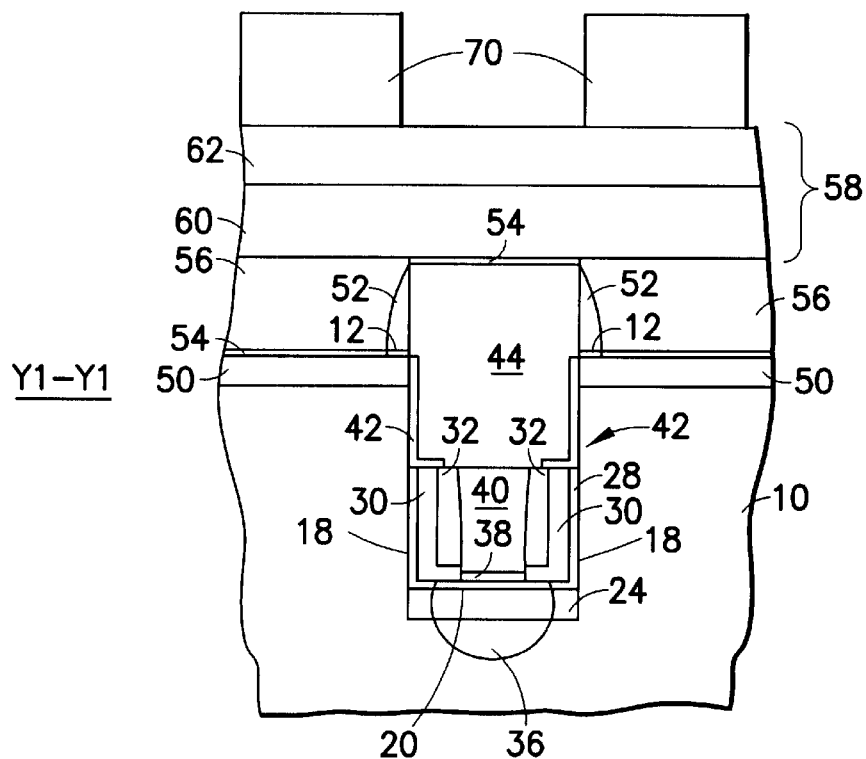
Figure 17C:
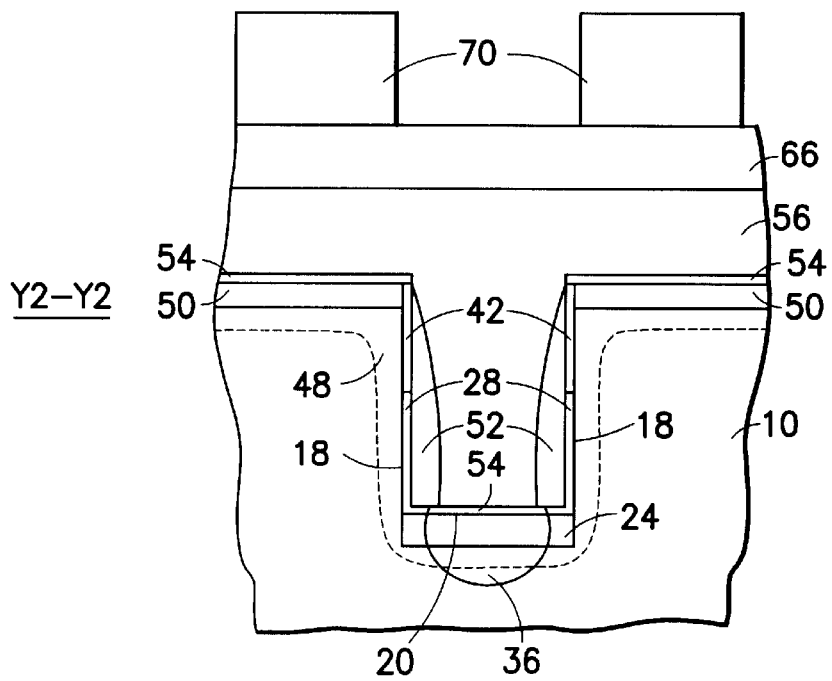

At this point of the present invention, the bitline may be optionally stitched, See FIGS. 17A (top view) 17B (cut through Y1—Y1) and 17C (cut through Y2—Y2). Specifically, by forming bitline contact studs 68 (borderless to the wordlines), an additional bitline wiring layer 70 may be deposited and patterned to form low-resistance bitlines.

The flash memory structure of the present invention has a high-density on the order of about $2F_2$. In addition to increased density, the inventive flash memory cell also exhibits superior performance as compared to a prior art flash memory cell. The high-concentration implant applied to the source line (i.e., program line 36) reduces all the concerns such as punchthrough and breakdown effects. Alternate operation of the source lines plus two-bit cell structure allows each pair of cell to be programmed in two cycles. The two-bit cell can be used for twin-cell operation to store complimentary bit data to enhance the signal margin against noise. On the other hand, the two-bit cell density can store two different data bits to fully use the array density capacity. The cell operation scheme, such as using over-erasure, and the combination of source side programming due to source side coupling are not available with prior art flash memory cells formed in trenches. This permits the inventive flash memory cell to exhibit high performance with minimal secondary effects such as read induced program or vice versa.

While the present invention has been described and shown with respect to preferred embodiments thereof, it will understood by those skilled in the art that the foregoing and other changes in forms and details may be made without departing from the spirit and scope of the present application. It is therefore intended that the present application not be limited by the exact forms described and illustrated, but fall within the scope, of the appended claims.

Having thus described our invention in detail, what we claim is new and desire to secure by the Letters Patent is:

1. A $2F^2$ flash memory cell structure comprising:
    a Si-containing substrate having a plurality of trenches formed therein, each trench having sidewalls that extend to a bottom wall, a length and individual segments that include two memory cell elements per segment, each memory cell element comprising (i) a floating gate region having L-shaped gates formed on a lower portion and not on an upper portion of each trench sidewall; (ii) a program line overlapping one side of said L-shaped gates present at said bottom wall of each trench and extending along said entire length of said plurality of trenches; and (iii) a control gate region overlying said floating gate region, said control gate region including gates formed on the upper portions and not on the lower portions of said sidewalls of said trenches, said gates are coupled to said floating gate regions;
    bitline diffusion regions formed in said Si-containing semiconductor substrate abutting each trench segment; and
    wordlines that lay orthogonal to said trenches, said wordlines being in contact with a top surface of each control gate region.

2. The $2F^2$ flash memory cell structure of claim 1 wherein said two memory cell elements store two bits of data.

3. The $2F^2$ flash memory cell structure of claim 1 wherein said two memory cell elements store one bit of data with complementary values.

4. The $2F^2$ flash memory cell structure of claim 1 wherein said program line is separately controlled during reading and programming operations.

5. The $2F^2$ flash memory cell structure of claim 1 wherein said floating gate regions further include a first gate dielectric, said first gate dielectric is selected from the group consisting of an oxide, oxynitride and multilayers thereof.

6. The $2F^2$ flash memory cell structure of claim 1 wherein said floating gates are comprised of doped polysilicon.

7. The $2F^2$ flash memory cell structure of claim 1 wherein said program line is an N+ or P+ implant region.

8. The $2F^2$ flash memory cell structure of claim 1 wherein said control gate region further includes a control gate polysilicon layer.

9. The $2F^2$ flash memory cell structure of claim 1 wherein said gates of said control gate region comprise a dielectric material selected from the group consisting of an oxide, oxynitride and multilayers thereof.

10. The $2F^2$ flash memory cell structure of claim 8 wherein said control gate polysilicon and said bitline diffusion regions include a salicide layer formed thereon.

11. The $2F^2$ flash memory cell structure of claim 1 wherein said wordlines include at least a conductive metal or metal silicide.

12. The $2F^2$ flash memory cell structure of claim 1 wherein an additional wiring layer is present atop said wordlines.

13. The $2F^2$ flash memory cell structure of claim 1 wherein said segments including said two memory cells elements are separated by trench segments that are filled with an insulating material.

14. The $2F^2$ flash memory cell structure of claim 1 wherein said memory cell elements are subjected to over erasure, programming and reading.

* * * * *